(12) United States Patent
Nikhade

(10) Patent No.: US 6,441,650 B2
(45) Date of Patent: *Aug. 27, 2002

(54) OFFSET COMPARATOR AND METHOD FOR FORMING SAME

(75) Inventor: Vaishali Nikhade, Irvine, CA (US)

(73) Assignee: ADMtek Incorporated, Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/299,355

(22) Filed: Apr. 26, 1999

(51) Int. Cl.[7] .................................................. H03K 5/22
(52) U.S. Cl. ............................ 327/66; 327/53; 327/83; 365/189.07
(58) Field of Search ............................. 327/50–55, 63, 327/65, 66, 67, 68, 83, 90, 560–563, 574, 581; 330/252, 253, 256, 257; 365/189.07

(56) References Cited

U.S. PATENT DOCUMENTS 5,039,888 A * 8/1991 Bell et al. ..................... 327/73
5,589,785 A * 12/1996 Garavan ........................ 327/63

* cited by examiner

Primary Examiner—Timothy P. Callahan
Assistant Examiner—Minh Nguyen
(74) Attorney, Agent, or Firm—Alston & Bird LLP

(57) ABSTRACT

The comparator includes a differential stage having a first input and a second input, an output stage in which the output is zero when the two inputs have therebetween a specific voltage difference, and a biasing stage providing a first biasing voltage and a second biasing voltage for respectively creating a second input voltage and a first input voltage respectively in the second and first inputs such that the two input voltages have therebetween the specific voltage difference. A method for forming the same includes steps of a) providing the differential stage, b) providing the output stage and c) providing the biasing stage which has a characteristic dependent on a manufacturing parameter such that the specific voltage difference is independent of the manufacturing parameter.

26 Claims, 7 Drawing Sheets

US 6,441,650 B2

OFFSET COMPARATOR AND METHOD FOR FORMING SAME

FIELD OF THE INVENTION

The present invention relates to a comparator or its forming method, and more particularly to an offset comparator and its forming method.

BACKGROUND OF THE INVENTION

As well known in the art, the resistor is generally used to create an offset or a threshold or trip voltage in a comparator. FIG. 1 shows a comparator with a threshold offset caused by using a resistor. The offset comparator includes a differential stage 30 having a first input V01 and a second input V02, an output stage 40 electrically connected to differential stage 30 such that the output V0 is zero when two inputs V01 and V02 have therebetween a specific voltage difference. A biasing stage 50 having two source followers SF1 and SF2 being equally biased by Vb1 to be respectively electrically connected to inputs V02 and V01 of differential stage 30. A resistor 14 is electrically connected in source follower SF2 for providing an offset in the comparator. Transistors 12 and 13 constitute the first source follower SF1 where the voltage at input V02 is a threshold below the comparator input Vin2. Transistors 11 and 10 and resistor 14 constitute a second source follower SF2 in which the voltage at the point Vr1 is a threshold below the comparator input Vin1 and the voltage at differential input V01 is an IR drop below the voltage at point Vr1. The offset in the comparator transfer function is created due to resistor 14 which creates an offset between differential inputs V01 and V02.

For a threshold offset comparator, output V0 is non-zero when both inputs V01 and V02 are equal. Hence, an offset needs to be created between two inputs V01 and V02 of differential stage 30 when the two inputs Vin1 and Vin2 to source followers SF1 and SF2 are equal, in order to create an offset in the transfer function of differential stage 30.

As mentioned above, the resistor is commonly used to generate an offset or a trip voltage in the comparator. When both comparator inputs Vin1 and Vin2 are equal, the outputs V01 and V02 of source followers SF2 and SF1 are deliberately made unequal. When one of comparator inputs Vin1 and Vin2 exceeds the other input by a certain value, source follower outputs or differential stage inputs V01 and V02 are equal. That value is called the trip voltage of the comparator and the output V0 of the comparator is zero in this value. The above-mentioned mode of operation creates an offset in the comparator output.

Resistor 14 is the key to creating an offset in the comparator transfer function. The variation of the resistor across different process corners and temperatures, however, will cause the comparator threshold voltage to vary. In the past, compensated resistors are proposed to overcome this situation. The resistor compensation, however, will require some complex circuit design. This will lead to an increased silicon area and more power consumption. Moreover, resistors have parasitic capacitances associated therewith which will lead to a reduced bandwidth.

It is therefore tried by the Applicant to deal with the above situations encountered in the prior art.

SUMMARY OF THE INVENTION

It is therefore an object of the present invention to provide a method of forming a comparator for alleviating problems associated with a comparator using a resistor.

It is further an object of the present invention to provide a resistorless threshold offset comparator.

In addition, an object of the present invention to provide an offset comparator having a resistorless bias compensation.

It is still an object of the present invention to provide an offset comparator having a threshold voltage independent of different process corners and/or temperatures.

It is yet an object of the present invention to provide an offset comparator having a reduced silicon area.

It is one more object of the present invention to provide an offset comparator being better in terms of portability and/or area efficiency.

It is again an object of the present invention to provide an offset comparator suitable for use in an increased bandwidth.

It is once more an object of the present invention to provide an offset comparator in which the process compensation is automatically implemented as a part of the bias circuit.

It is nevertheless an object of the present invention to provide an offset comparator having a simple compensation technique.

It is furthermore an object of the present invention to provide a compensated offset comparator having a less power consumption.

According to an aspect of the present invention, an offset comparator includes a differential stage having a first input and a second input, an output stage electrically connected to the differential stage such that the output is zero when the two inputs have therebetween a specific voltage difference, and a biasing stage electrically connected to the differential stage, providing a first biasing voltage for creating a second input voltage in the second input and providing a second biasing voltage for creating a first input voltage in the first input such that the two input voltages have therebetween the specific voltage difference.

The biasing stage generally includes a first voltage provider for providing the second input voltage, and a second voltage provider for providing the first input voltage.

Certainly, the first and second voltage providers can respectively be a first source follower and a second source follower. The second biasing voltage can be lower than the first biasing voltage, or alternatively, the first biasing voltage lower than the second voltage.

Preferably, the comparator further includes a first diode connected transistor electrically connected to the first source follower for providing thereto a first biasing current, and a second diode connected transistor electrically connected to the second source follower for providing thereto a second biasing current.

Certainly, the first biasing current can be lower than the second biasing current, or alternatively higher than the second biasing current.

The present comparator can further include a diode connected transistor electrically connected to the second voltage provider for providing thereto a relatively constant biasing current. Alternatively, the present comparator preferably includes a bias-compensating circuit electrically connected to the second voltage provider so that the comparator can produce a fixed trip voltage.

Certainly, the bias-compensating circuit can include a fixed biasing current circuit for providing a fixed biasing current, and a variable current circuit electrically connected to the fixed biasing current circuit for providing a manufacturing parameter-dependent current.

Preferably, the fixed biasing current is a diode connected transistor obtaining the fixed biasing current from a bias circuit. The variable current circuit includes a complementary pair of transistors provided with a fixed bandgap voltage.

Preferably, the present comparator further includes a current mirror electrically connected to the variable current circuit for providing the second voltage provider with a current being a summation of the fixed biasing current and the variable current.

Preferably, the present comparator further includes a diode connected transistor electrically connected between the current mirror and the second voltage provider.

In accordance with a second aspect of the present invention, an offset comparator includes a differential stage having a first input and a second input, an output stage electrically connected to the differential stage such that the output is zero when the two inputs have therebetween a specific voltage difference, and a resistorless biasing stage electrically connected to the differential stage, providing a first input voltage for the first input and providing a second input voltage for the second input such that the two input voltages have therebetween the specific voltage difference.

Certainly, the biasing stage can include a first voltage provider for providing the second input voltage, and a second voltage provider for providing the first input voltage. The first and second voltage providers can respectively be a first source follower and a second source follower.

Preferably, such comparator further includes a bias-compensating circuit electrically connected to the second voltage provider so that the comparator can produce a fixed trip voltage.

Certainly, the bias-compensating circuit can include a fixed biasing current circuit for providing a fixed biasing current, and a variable current circuit electrically connected to the fixed biasing current circuit for providing a manufacturing parameter-dependent current.

Preferably, such comparator further includes a current adder electrically connected to the variable current circuit for providing the second voltage provider with a current being a summation of the fixed biasing current and the variable current.

Certainly, the current adder can be a current mirror. The manufacturing parameter-dependent current depends on a specific manufacturing process and a specific manufacturing temperature.

In accordance with a third aspect of the present invention, an offset comparator includes a differential stage having a first input and a second input, an output stage electrically connected to the differential stage such that the output is zero when the two inputs have therebetween a specific voltage difference, a first voltage provider electrically connected to the second input for providing therewith a second input voltage, a second voltage provider electrically connected to the first input for providing therewith a first input voltage, and a biasing circuit electrically connected to the first and second voltage providers for respectively differentially biasing therefor such that the two input voltages have therebetween the specific voltage difference.

Preferably, the biasing circuit provides a first biasing voltage to the second voltage provider and a second biasing voltage to the first voltage provider.

Preferably, this comparator further includes a bias-compensating circuit electrically connected to the second voltage provider so that the comparator can produce a fixed trip voltage. The bias-compensating circuit includes a fixed biasing current circuit for providing a fixed biasing current, and a variable current circuit electrically connected to the fixed biasing current circuit for providing a manufacturing parameter-dependent current.

Preferably, the fixed biasing current is a diode connected transistor obtaining the fixed biasing current from a bias circuit. The variable current circuit includes a complementary pair of transistors provided with a fixed bandgap voltage.

Preferably, this comparator further includes a current adder electrically connected to the variable current circuit for providing the second voltage provider with a current being a summation of the fixed biasing current and the variable current.

In accordance with a fourth aspect of the present invention, a method for forming an offset comparator comprising the steps of a) providing a differential stage having a first input and a second input, b) providing an output stage electrically connected to the differential stage such that the output is zero when the two inputs have therebetween a specific voltage difference, and c) providing a biasing stage which has a characteristic dependent on a manufacturing parameter, is electrically connected to the differential stage, provides a first biasing voltage for creating a second input voltage in the second input and provides a second biasing voltage for creating a first input voltage in the first input such that the two input voltages have therebetween the specific voltage difference independent of the manufacturing parameter.

Certainly, the manufacturing parameter can include a manufacturing process corner and a manufacturing temperature. The biasing stage includes a first voltage provider for providing the second input voltage and a second voltage provider for providing the first input voltage.

Preferably, the present method further includes a step of d) providing a bias-compensating circuit electrically connected to the second voltage provider for providing for the comparator the specific voltage difference. The bias-compensating circuit includes a fixed biasing current circuit for providing a fixed biasing current, and a variable current circuit electrically connected to the fixed biasing current circuit for providing a manufacturing parameter-dependent current.

Preferably, the present method further includes a step of e) providing a current adder electrically connected to the variable current circuit for providing the second voltage provider with a current being a summation of the fixed biasing current and the variable current.

The present invention may best be understood through the following descriptions with reference to the accompanying drawings, in which:

DETAILED DESCRIPTION OF THE PREFERRED EMBODIMENT

Figure 2:
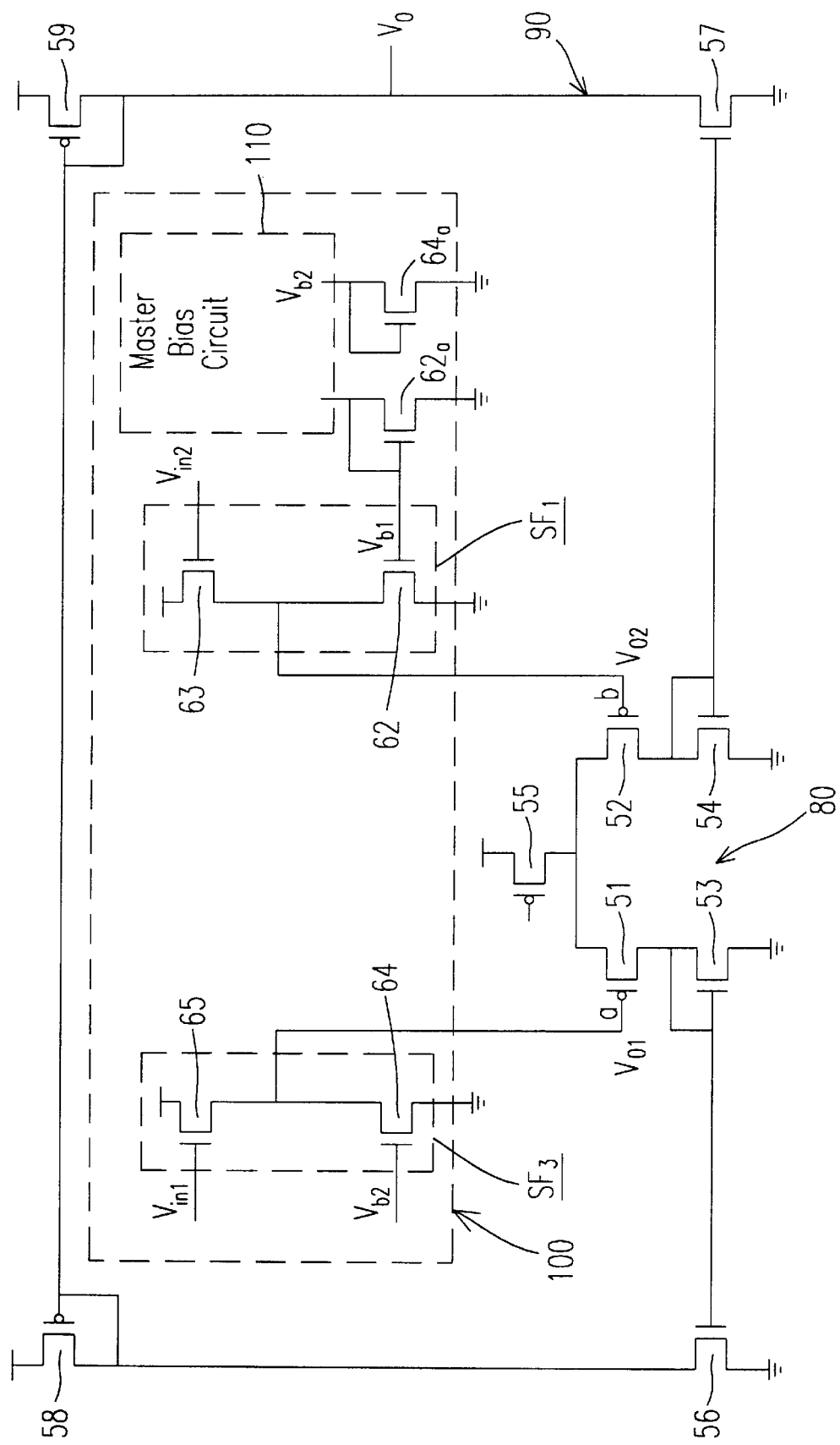
FIG. 2 is a schematical circuit diagram showing a preferred embodiment of a comparator according to the present invention.

Referring now to FIG. 2, there is shown an offset comparator according to the present invention which includes a differential stage 80 having a first input a and a second input b, an output stage 90 electrically connected to differential stage 80 such that the output V0 is zero when two inputs V01 and V02 have therebetween a specific voltage difference, and a biasing stage 100 electrically connected to differential stage 80, providing a first biasing voltage Vb1 for creating a second input voltage V02 in second input b and providing a second biasing voltage Vb2 for creating a first input voltage V01 in first input a such that two input voltages V01 and V02 have therebetween the specific voltage difference. Biasing stage 100 normally includes a first voltage provider for providing the second input voltage V02 and a second voltage provider for providing the first input voltage V01 wherein the first and second voltage providers normally are respectively a first source follower and a second source follower SF1 and SF3 being differently biased by Vb1 and Vb2 to be respectively electrically connected to inputs a and b of differential stage 80. Transistors 62 and 63 constitute the first source follower SF1 and transistors 64 and 65 constitute a third source follower SF3. Output stage 90 consists of nFET 57 and pFET 59 biased from the nFETs 54 and 53 of the differential stage 80. Differential stage 80 includes two nFETs 53 and 54 and three pFETs 51, 52 and 55. Since the bias current to transistor 64 is greater than the bias current to transistor 62, it will create an offset in the transfer function for third source follower SF3 (compared to first source follower SF1), similar to the offset obtained by using the resistor in the second source follower SF2 in the prior art.

For a MOSFET in saturation, the current through the device can be approximated as:

$$I_D = \beta/2(V_{GS} - V_{TH})^2 \qquad \text{Equation (1)}$$

$$\beta = \mu C_{OX} W/L \qquad \text{Equation (2)}$$

Where $I_D$ is the drain current through the device, $V_{GS}$ is the gate to source voltage of the device, $V_{TH}$ is the threshold voltage of the device, $\mu$ is the carrier mobility, $C_{OX}$ is the oxide capacitance, W is the width of the device and L is the length of the device.

From Equation (1), the gate-source voltage of a transistor is $$V_{GS} = V_{TH} + (2I_D/\beta)^{1/2} \qquad \text{Equation (3)}$$

Since input voltages V01 and V02 of the differential amplifier 80 will follow input voltages Vin1 and Vin2 of the comparator, the output V0 is 0 when input voltages V01 and V02 are equal. The output V0 will be low when input voltage V01 is greater than input voltage V02 and output V0 will be high when input voltage V01 is less than input voltage V02 so that the comparator operation will depend on the difference between the gate to source voltages $V_{GS1}$ and $V_{GS2}$ of transistors 51 and 52 as indicated in the following Equation (6).

$$V_{GS1} = V_{TH1} + (2I_{D1}/\beta_1)_{1/2} \qquad \text{Equation (4)}$$

$$V_{GS2} = V_{TH2} + (2I_{D2}/\beta_2)_{1/2} \qquad \text{Equation (5)}$$

$$V_{GS1} - V_{GS2} = (2I_{D1}/\beta_1)^{1/2} - (2I_{D2}/\beta_2)^{1/2} + (V_{TH1} - V_{TH2}) \qquad \text{Equation (6)}$$

For a threshold offset comparator, output V0 is non-zero when both differential input voltages V01 and V02 are equal. Hence, an offset needs to be created between two input voltages V01 and V02 of differential stage 80 when the two inputs Vin1 and Vin2 to source followers SF3 and SF2 are equal, in order to create an offset in the transfer function of differential amplifier 80.

Figure 3:
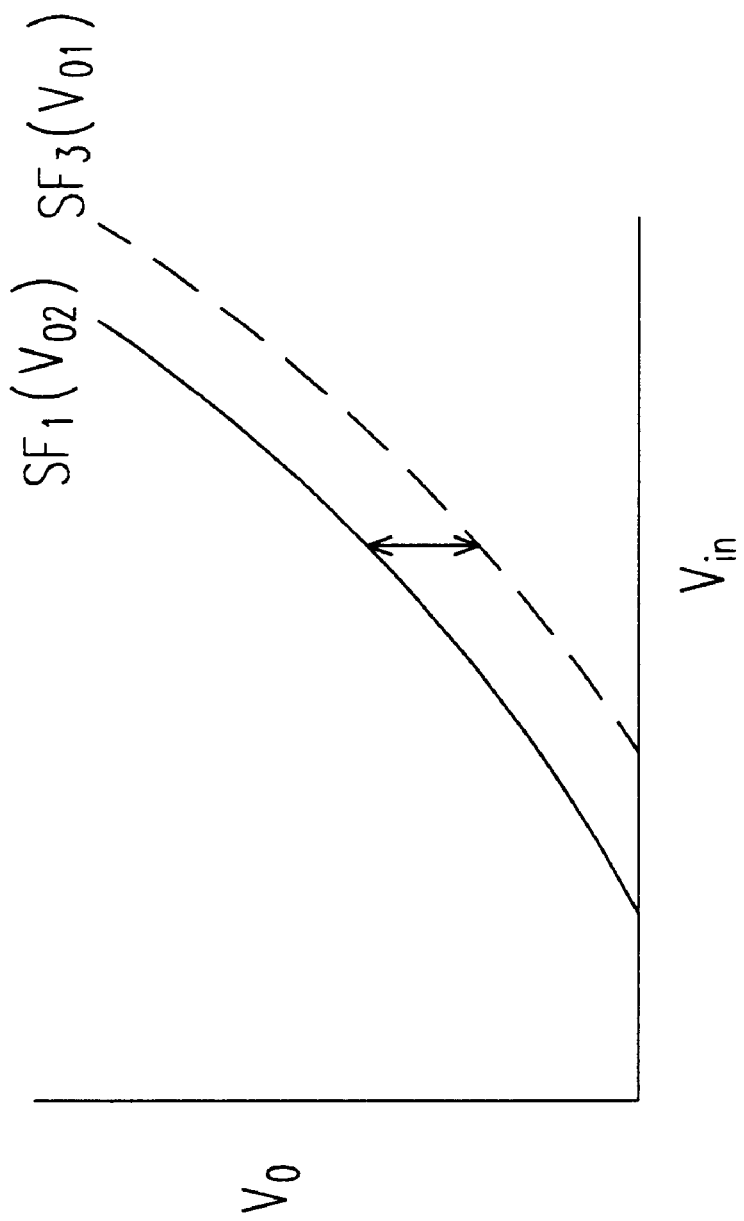
FIG. 3 is a schematical diagram illustrating transfer functions for source followers in comparator in FIG. 2.
Figure 4:
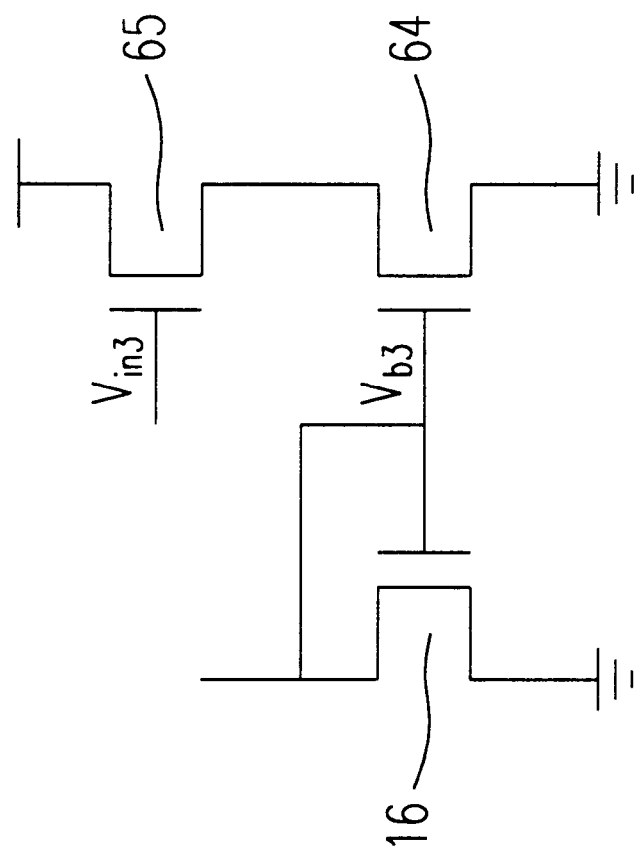
FIG. 4 is a schematical diagram showing a biasing circuit for a comparator according to the present invention.
Figure 5:
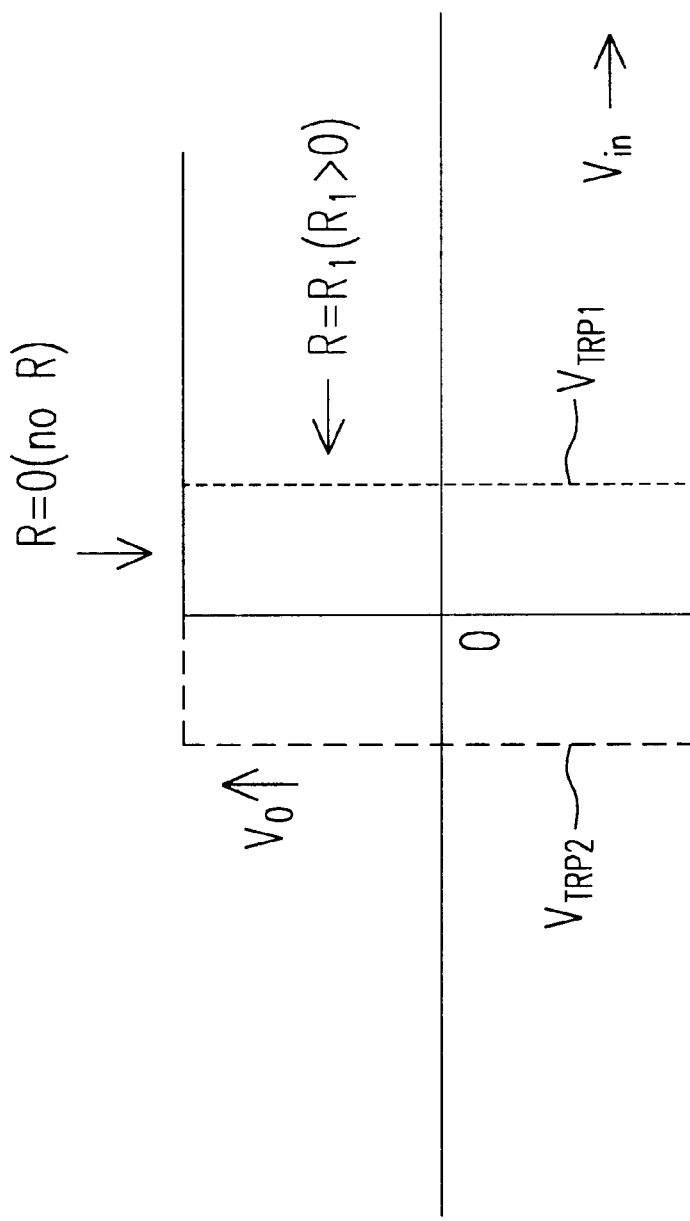
FIG. 5 is a schematic plot showing a transfer function for a comparator in FIG. 2.

A nifty technique is presented to eliminate the use of resistor in a threshold offset comparator. The identical transfer function for SF1 and SF3 is shown in FIG. 3. An identical transfer function can be obtained with a conventional resistor or without using a resistor as contemplated by the present invention. As an example, the source follower SF3 shown in FIGS. 2 or 4 is provided for this purpose. The bias currents provided to transistors 62 and 64 are different in this embodiment which means that the use of resistor can be avoided by using different bias currents for transistors 62 and 64. FIG. 5 shows the comparator transfer function with and without the resistor 'R'.

Figure 7:
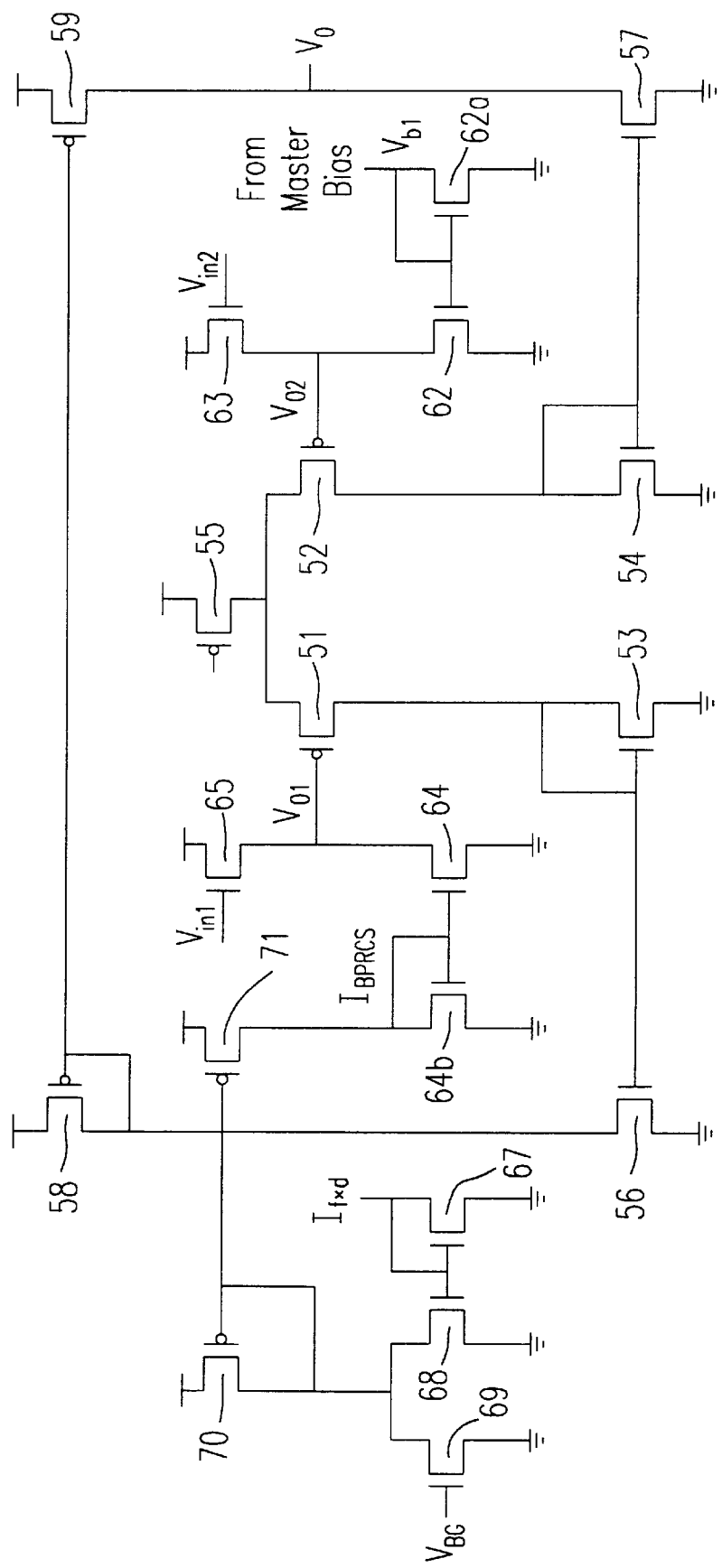
FIG. 7 is a schematic circuit diagram showing another preferred embodiment of a comparator according to the present invention.

In this comparator in FIG. 7, a first diode connected transistor 62a is electrically connected to first source follower SF1 for providing thereto a first biasing current, and a second diode connected transistor 64b is electrically connected to third source follower SF3 for providing thereto a third biasing current, in which the first and third biasing currents are provided from a master bias circuit 110.

Variation of the comparator trip voltage however is still present in the circuit in FIG. 2, due to the variation of 'β' in Equation (2). Compared to FIG. 2, as shown in FIG. 4, we can let master bias circuit 110 to produce a reference current for transistor 66. It is known that if the bias current provided to transistor 64 is obtained from a diode connected transistor 16 electrically connected to third source follower SF3, the biasing current will be relatively constant with process and temperature. Characteristics of a transistor, however, are not identical over process and temperature for a constant bias current. From Equation (1), we know β, $V_{GS}$ and $V_{TH}$ will change with process and temperature for an $I_D$ of a particular value. The variation of β with process and temperature for a particular value of $I_D$ causes $V_{GS}$ and $V_{TH}$ to vary. This produces a variation in the transfer characteristics of SF3 over process and temperature so that an offset in the trip voltage is produced in the comparator.

Figure 1:
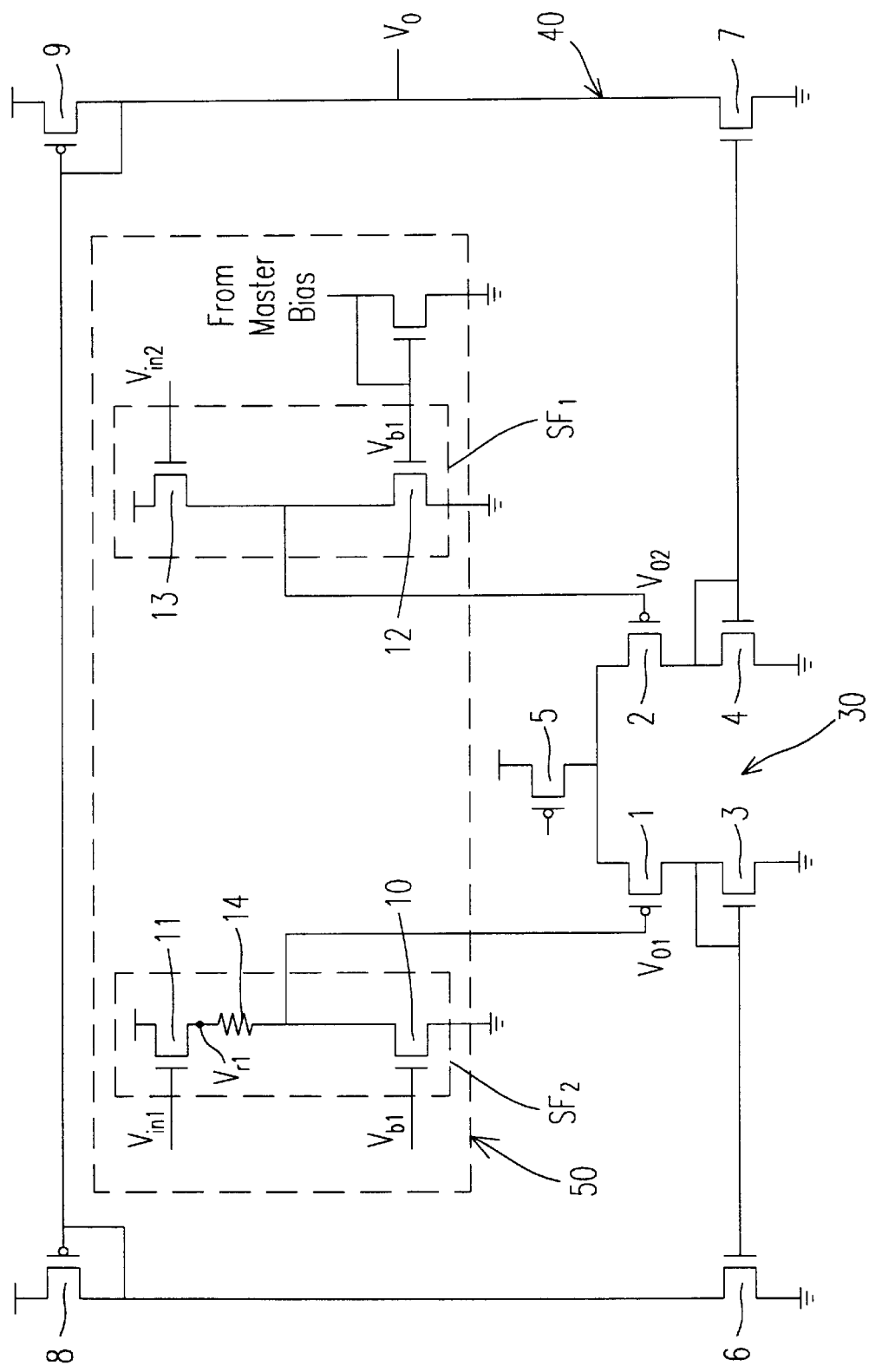
FIG. 1 is a schematical circuit diagram showing a general architecture of and a prior art of a comparator.
Figure 6:
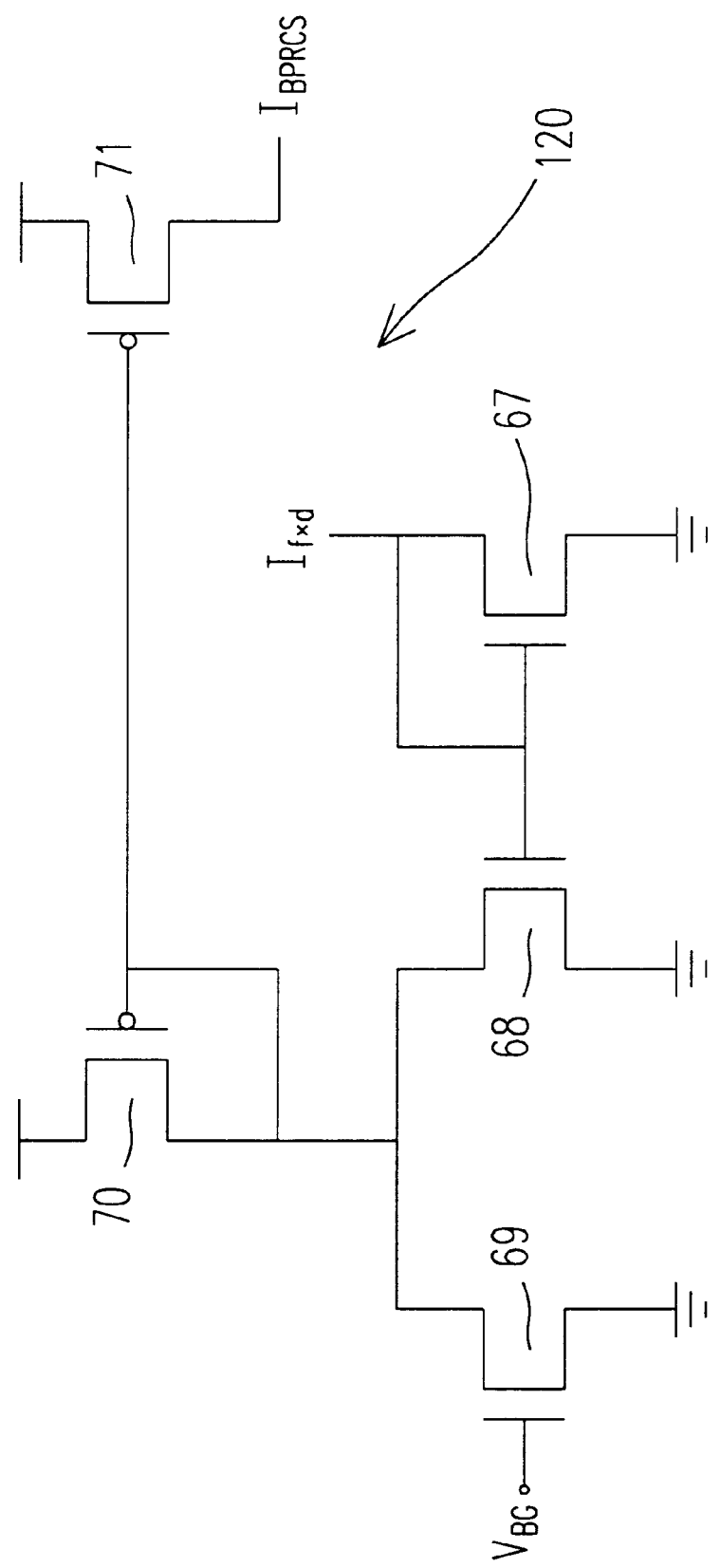
FIG. 6 is a schematic circuit diagram showing a compensating bias circuit for a comparator according to the present invention.

In order to obtain a relatively constant trip voltage with process and temperature, it is thus designed to vary the bias current provided to transistor 64 with process and temperature. The variation of the bias current is such that a transistor's characteristics are identical over process and temperature. The varying bias current will thus create the effect of a constant β with process and temperature. This forms a specific aspect of the present invention. Specifically, the present comparator further includes a bias-compensating circuit 120, as shown in FIG. 6, electrically connected to third source follower SF3 for providing a fixed trip voltage for the present comparator. Bias-compensating circuit 120 includes a fixed biasing current circuit being a diode connected transistor 67 for providing a fixed biasing current $I_{fxd}$ obtained from master bias circuit 110. The variable current circuit consists of nFET 69 provided with a fixed voltage $V_{BG}$ obtained from the bandgap reference for providing a manufacturing parameter-dependent current. Since the voltage $V_{BG}$ is constant with process and temperature, the current in transistor 69 varies with process and temperature so that the current mirror formed by a complementary pair of pMOSFETs 70 and 71 and electrically connected to the fixed biasing current circuit (67) and the variable current circuit (68 and 69) will provide third source follower SF3 with a current $I_{BPRCS}$ with a summation of fixed biasing current $I_{fxd}$ and the variable current in the variable current circuit (69). Since the current in transistor 69 is variable with process and temperature, the resultant current $I_{BPRCS}$ is also variable with process and temperature. As shown in FIG. 7, through a diode connected transistor 64b electrically connected between the current mirror (70 and 71) and third source follower SF3, the variable current or the process compensated bias current $I_{BPRCS}$ in transistor 71 will in turn maintain a relatively fixed offset between differential inputs V01 and V02 with process and temperature. This effect is equivalent to having a fixed resistor 14 in FIG. 1 with less than 5% variation.

By using a similar approach, a comparator with a negative trip voltage can also be obtained. The curve with the offset voltage $V_{TRP2}$ in FIG. 5 indicates the transfer function of such a comparator. In FIG. 7, such comparator can be obtained by interchanging the bias circuits for transistors 62 and 64. In other words, the third biasing voltage can be optionally lower or higher than the first biasing voltage, or the third biasing current can be made lower or higher than the first biasing current as desired.

Observing differently, the present invention aims to provide a resistorless biasing stage 100 for an offset comparator wherein the resistorless biasing stage 100 provides a first input voltage V01 for the first differential input and a second input voltage V02 for the second differential input such that the two input voltages V01 and V02 have therebetween a specific voltage difference.

In resistorless biasing stage 100, there is a bias-compensating circuit 120 for providing for the present comparator an absolutely fixed trip voltage or a relatively manufacturing parameter-dependent current. Generally speaking, the bias-compensating circuit includes a fixed biasing current circuit for providing a fixed biasing current and a variable current circuit for providing a manufacturing parameter-dependent current. There also is included a current adder, e.g. a current mirror, electrically connected to the variable current circuit for providing a current being a summation of the fixed biasing current and the variable current. Generally, the manufacturing parameter includes a specific manufacturing process and a specific manufacturing temperature.

Considering differently, the present comparator includes a differential stage 80 having a first input a and a second input b, an output stage 90 having an output V0 being zero when two input voltages V01 and V02 have therebetween a specific voltage difference, a first voltage provider SF1 electrically connected to second input b for providing therewith a second input voltage V02, a third voltage provider SF3 electrically connected to first input a for providing therewith a first input voltage V01, and a biasing circuit 100 electrically connected to the first and third voltage providers SF1 and SF3 for respectively differentially biasing therefor such that the two input voltages V01 and V02 have therebetween the specific voltage difference.

Preferably, the present comparator further includes a bias-compensating circuit 120 electrically connected to the third voltage provider SF3 for providing for the present comparator a fixed trip voltage.

From the method side, it might be more easy to find the feature of the present invention. Accordingly, a method for forming an offset comparator according to the present invention includes the steps of a) providing a differential stage 80 having a first input a and a second input b, b) providing an output stage 90 electrically connected to differential stage 80 such that the output V0 is zero when the voltages in the two inputs a and b have therebetween a specific voltage difference, and c) providing a biasing stage 100 which has a characteristic dependent on a manufacturing parameter, e.g. process and temperature, is electrically connected to differential stage 80, provides a first biasing voltage Vb1 for creating a second input voltage V01 in second input b and provides a second biasing voltage Vb2 for creating a first input voltage V01 in first input a such that the two input voltages V01 and V02 have therebetween the specific voltage difference independent of the manufacturing parameter.

Normally, biasing stage 100 includes a first voltage provider SF1 for providing the second input voltage V02 and a third voltage provider SF3 for providing the first input voltage V01. The present method further comprises a step of d) providing a bias-compensating circuit 120 electrically connected to third voltage provider SF3 for providing for the comparator the specific voltage difference. Such bias-compensating circuit 120 includes a fixed biasing current circuit 67 for providing a fixed biasing current $I_{fxd}$, and a variable current circuit (68 and 69) for providing a manufacturing parameter-dependent current. The present method further includes a step of e) providing a current adder electrically connected to the variable current circuit (68 and 69) for providing the third voltage provider SF3 with a current $I_{BPRCS}$ being a summation of the fixed biasing current $I_{fxd}$ and the variable current.

While the invention has been described in terms of what are presently conedgered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

I claim:

1. An offset comparator comprising:
  a differential stage having a first input and a second input;
  an output stage electrically connected to said differential stage in order that an output of said comparator is zero when said two inputs have therebetween a specific voltage difference; and
  a biasing stage electrically connected to said differential stage comprising:
    a first source follower for providing a first biasing voltage for creating a second input voltage to said second input;
    a second source follower for providing a second biasing voltage for creating a first input voltage to said first input in order that said two input voltages have therebetween said specific voltage difference;
    a first diode connected transistor electrically connected to said first source follower for providing thereto a first biasing current; and
    a second diode connected transistor electrically connected to said second source follower for providing thereto a second biasing current.

2. A comparator according to claim 1 wherein said second biasing voltage is lower than said first biasing voltage.

3. A comparator according to claim 1 wherein said first biasing voltage is lower than said second biasing voltage.

4. A comparator according to claim 1 wherein said first biasing current is lower than said second biasing current.

5. A comparator according to claim 1 wherein said first biasing current is higher than said second biasing current.

6. An offset comparator comprising:
a differential stage having a first input and a second input;
an output stage electrically connected to said differential stage in order that an output of said comparator is zero when said two inputs have therebetween a specific voltage difference; and
a biasing stage electrically connected to said differential stage comprising:
a first voltage provider for providing a second input voltage to said second input;
a second voltage provider for providing a first input voltage to said first input in order that said two input voltages have therebetween said specific voltage difference; and
a diode connected transistor electrically connected to said second voltage provider for providing thereto a relatively constant biasing current.

7. An offset comparator comprising:
a differential stage having a first input and a second input;
an output stage electrically connected to said differential stage in order that an output of said comparator is zero when said two inputs have therebetween a specific voltage difference;
a biasing stage electrically connected to said differential stage, and providing a first biasing voltage for creating a second input voltage in said second input and providing a second biasing voltage for creating a first input voltage in said first input in order that said two input voltages have therebetween said specific voltage difference; and
a bias-compensating circuit electrically connected to said biasing stage, which provides a bias current independent from said output of said comparator for compensating said second biasing voltage so as to provide a fixed trip voltage for said comparator, wherein said bias-compensating circuit includes:
a fixed biasing current circuit for providing a fixed biasing current; and
a variable current circuit electrically connected to said fixed biasing current circuit for providing a manufacturing parameter-dependent current.

8. A comparator according to claim 7 wherein said fixed biasing current circuit is a diode connected transistor obtaining said fixed biasing current from a bias circuit.

9. A comparator according to claim 7 wherein said variable current circuit includes a transistor provided with a fixed bandgap voltage.

10. A comparator according to claim 7 wherein said biasing stage includes:
a first voltage provider for providing said second input voltage; and
a second voltage provider for providing said first input voltage.

11. A comparator according to claim 10, further comprising a current mirror electrically connected to said variable current circuit for providing said second voltage provider with a current being a summation of said fixed biasing current and said variable current.

12. A comparator according to claim 11, further comprising a diode connected transistor electrically connected between said current mirror and said second voltage provider.

13. An offset comparator comprising:
a differential stage having a first input and a second input;
an output stage electrically connected to said differential stage in order that an output of said comparator is zero when said two inputs have therebetween a specific voltage difference;
a resistorless biasing stage electrically connected to said differential stage, providing a first biasing voltage for creating a second input voltage in said second input and providing a second biasing voltage for creating a first input voltage in said first input in order that said two input voltages have therebetween said specific voltage difference; and
a bias-compensating circuit electrically connected to said biasing stage, which provides a bias current independent from said output of said comparator for compensating said second biasing voltage so as to provide a fixed trip voltage for said comparator, wherein said bias-compensating circuit includes:
a fixed biasing current circuit for providing a fixed biasing current; and
a variable current circuit electrically connected to said fixed biasing current circuit for providing a manufacturing parameter-dependent current.

14. A comparator according to claim 13 wherein said biasing stage includes:
a first voltage provider for providing said second input voltage; and
a second voltage provider for providing said first input voltage.

15. A comparator according to claim 14 wherein said first and second voltage providers are respectively a first source follower and a second source follower.

16. A comparator according to claim 14, further comprising a current adder electrically connected to said variable current circuit for providing said second voltage provider with a current being a summation of said fixed biasing current and said variable current.

17. A comparator according to claim 13 wherein said manufacturing parameter-dependent current depends on a specific manufacturing process and a specific manufacturing temperature.

18. An offset comparator comprising:
a differential stage having a first input and a second input;
an output stage electrically connected to said differential stage in order that an output of said comparator is zero when two inputs have therebetween a specific voltage difference;
a first voltage provider electrically connected to said second input for providing therewith a second input voltage;
a second voltage provider electrically connected to said first input for providing therewith a first input voltage;
a biasing circuit electrically connected to said first and second voltage providers for providing a first biasing voltage to said second voltage provider and a second biasing voltage to said first voltage provider in order that said two input voltages have therebetween said specific voltage difference; and
a bias-compensating circuit electrically connected to said second voltage provider, which provides a bias current independent from said output of said comparator for compensating said second biasing voltage so as to provide a fixed trip voltage for said comparator, wherein said bias-compensating circuit includes:

a fixed biasing current circuit for providing a fixed biasing current; and a variable current circuit electrically connected to said fixed biasing current circuit for providing a manufacturing parameter-dependent current.

19. A comparator according to claim 18 wherein said first and second voltage providers are respectively two source followers.

20. A comparator according to claim 18 wherein said fixed biasing current is a diode connected transistor obtaining said fixed biasing current from said biasing circuit.

21. A comparator according to claim 18 wherein said variable current circuit includes a complementary pair of transistors provided with a fixed bandgap voltage.

22. A comparator according to claim 18, further comprising a current adder electrically connected to said variable current circuit for providing said second voltage provider with a current being a summation of said fixed biasing current and said manufacturing parameter-dependent current.

23. A method for forming an offset comparator comprising the steps of:

a) providing a differential stage having a first input and a second input;

b) providing an output stage electrically connected to said differential stage in order that an output of said output stage is zero when said two inputs have therebetween a specific voltage difference;

c) providing a biasing stage which has a characteristic dependent on a manufacturing parameter, is electrically connected to said differential stage, provides a first biasing voltage for creating a second input voltage in said second input and provides a second biasing voltage for creating a first input voltage in said first input in order that said two input voltages have therebetween said specific voltage difference independent of said manufacturing parameter; and d) providing a bias-compensating circuit electrically connected to said biasing stage for providing a bias current which is independent from said output of said output stage for compensating said second biasing voltage so as to provide said specific voltage difference, wherein said bias-compensating circuit includes:

a fixed biasing current circuit for providing a fixed biasing current; and a variable current circuit electrically connected to said fixed biasing current circuit for providing a manufacturing parameter-dependent current.

24. A method according to claim 23 wherein said manufacturing parameter includes a manufacturing process corner and a manufacturing temperature.

25. A method according to claim 23 wherein said biasing stage includes a first voltage provider for providing said second input voltage and a second voltage provider for providing said first input voltage.

26. A method according to claim 23, further comprising a step of e) providing a current adder electrically connected to said variable current circuit for providing said second voltage provider with a current being a summation of said fixed biasing current and said manufacturing parameter-dependent current.

* * * * *